United States Patent [19]
Kantimahanti et al.

[11] Patent Number: 5,747,369
[45] Date of Patent: May 5, 1998

[54] FORMATION OF A CAPACITOR USING A SACRIFICIAL ETCH STOP

[75] Inventors: Arjun Kumar Kantimahanti; Chivukula Subrahmanyam; Mei Sheng Zhou, all of Singapore, Singapore

[73] Assignee: Chartered Semiconductor Manufacturing Ltd., Singapore, Singapore

[21] Appl. No.: 782,706

[22] Filed: Jan. 13, 1997

[51] Int. Cl.$^6$ .................................. H01L 21/8242
[52] U.S. Cl. .................. 438/241; 438/256; 438/648
[58] Field of Search .......................... 438/241, 253, 438/256, 396, 399, 647, 648

[56] References Cited

U.S. PATENT DOCUMENTS

| | | | |
|---|---|---|---|
| 5,143,861 | 9/1992 | Turner | 438/256 |
| 5,371,028 | 12/1994 | Koh | 437/43 |
| 5,455,204 | 10/1995 | Dobuzinsky et al. | 437/238 |
| 5,510,630 | 4/1996 | Agarwal et al. | 257/77 |
| 5,523,596 | 6/1996 | Ohi et al. | 257/296 |

*Primary Examiner*—Chandra Chaudhari
*Attorney, Agent, or Firm*—George O. Saile; Stephen B. Ackerman

[57] ABSTRACT

A method is described for forming capacitors in integrated circuits by making the capacitors concurrently with the fabrication of the interconnection wiring levels. A single additional photolithographic step and two depositions are required to form capacitors within each wiring level. A key feature of the invention is the use of an etch-stop to protect the capacitor dielectric during contact or via etching. The storage plates of the capacitor are formed from two successive conductor levels which can include polysilicon levels as well. The process is particularly suited to the manufacture of logic circuits and can be used effectively in MOSFET, bipolar and BiCMOS processes.

30 Claims, 6 Drawing Sheets

FORMATION OF A CAPACITOR USING A SACRIFICIAL ETCH STOP

BACKGROUND OF THE INVENTION

1. Field of the Invention

The invention relates to processes for the manufacture of semiconductor devices and more particularly to processes for forming capacitors.

2. Description of Prior Art

Except for memory applications fabricated capacitors find limited usage in the very-large-scale-integrated(VLSI) circuits. Dynamic-random-access-memories(DRAMs) utilize fabricated capacitors as storage devices in huge cell arrays, each cell containing a single capacitor. The fabrication of these capacitors require multiple additional processing steps such as described, for example, by Ohi U.S. Pat. No. 5,523,596. Static-random-access-memories(SRAMs) and many logic circuits have limited usage of fabricated capacitors. Fabricated capacitors may be found in certain frequency sensitive logic circuit devices such as multivibrators. They are used extensively in analog circuits found in multimedia and modem chips.

Dobuzinsky U.S. Pat. No. 5,455,204 describes a method of forming a finned capacitor having an oxynitride dielectric. The device is formed at high temperatures (1100° C.) and is not compatible with formation on an integrated circuit chip.

Agarwal U.S. Pat. No. 5,510,630 forms the storage capacitor for a memory device by utilizing the gate polysilicon for one plate and an aluminum deposition to form both the bit line and the other plate. Contact openings for the bit line are made by masking the capacitor dielectric layer an then depositing the metal. The process does not use a planarized inter-level-dielectric(ILD) process.

SUMMARY OF THE INVENTION

It is an object of this invention to provide a method for forming custom capacitors in logic circuits or, more generally, in integrated circuits not dominated by cell arrays wherein capacitor fabrication alone requires multiple processing steps. Capacitor fabrication by the method of this invention requires only a single additional masking level and two additional deposition steps for each capacitor level. All other processing steps used to form the capacitor, except for a dip etch, are concurrent with the formation of the interconnection wiring levels of the integrated circuit.

This object is accomplished by first patterning the lower plate of the capacitor in a conductive layer, for example the gate polysilicon layer. Typically this lower plate would be formed over a region of field oxide. The capacitor dielectric, typically silicon oxide, is then deposited. A sacrificial layer of silicon oxynitride is deposited over the dielectric layer. A photoresist mask is then deposited and patterned to protect the silicon oxynitride layer over the region where the capacitor is to be formed.

After etching of the silicon oxyinitride layer and removal of the photoresist, the ILD layer is deposited and planarized. Contact openings are then formed including a contact for the upper plate of the capacitor. The silicon oxynitride layer in over the capacitor dielectric serves as an etch-stop, protecting the capacitor dielectric from the contact etch. The sacrificial silicon oxynitride layer is then removed from the capacitor opening, exposing the dielectric layer. Subsequently deposited conductive plugs form the conventional contacts plus the upper plate of the capacitor.

The extra mask used to protect the silicon oxynitride etch stop is not considered a critical mask with regard to alignment. Such a mask is sometimes referred to as a block-out mask. The dimensions of the contact opening over the capacitor determine the area of the upper plate of the capacitor.

Extension of the concepts of this invention permit the formation of capacitors between any two successive metallization levels.

DESCRIPTION OF THE PREFERRED EMBODIMENTS

In a first embodiment of this invention a capacitor is fabricated over a field oxide region having its electrode plates formed from a polysilicon layer which also forms MOSFET gates. A p-type silicon wafer is provided and field oxide regions are formed using well known techniques such as the local-oxidation-of-silicon(LOCOS).

Figure 1:
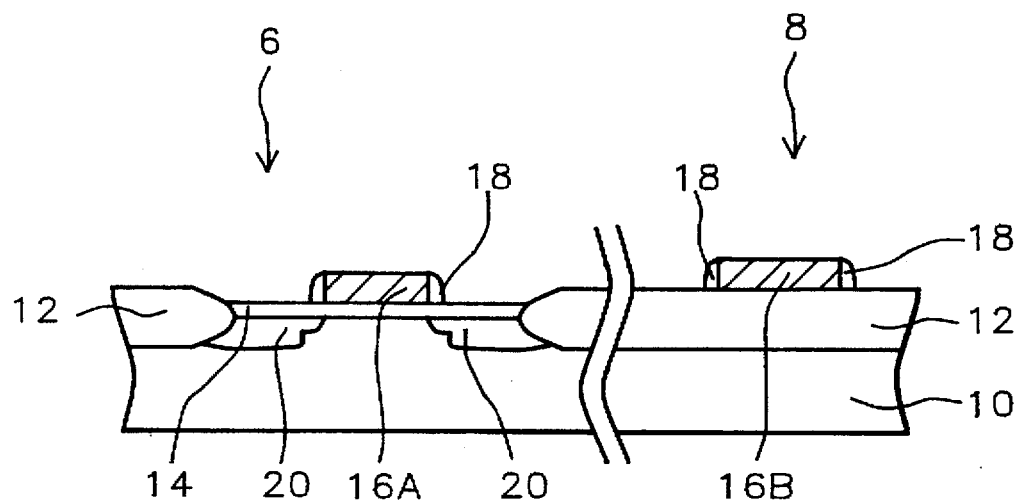
FIG. 1 through FIG. 6 are wafer cross sections showing the processing steps used to form a first embodiment of this invention.

The reader is referred to the cross section shown in FIG. 1. In the region 6 of the wafer 10, a self-aligned polysilicon gate MOSFET is to be formed, while in region 8, another area of the IC chip, a capacitor will be fabricated over the field oxide 12. A gate insulator 14 of silicon oxide is grown by thermal oxidation and a layer of polysilicon is deposited by low-pressure-chemical-vapor-deposition(LPCVD) and patterned by well known photolithographic methods and reactive-ion-etching(RIE) to form the MOSFET gate electrode 16A and the first electrode 16B of the capacitor.

Sidewall structures 18 are formed by a sequence of processing steps which include two ion-implants to form the lightly-doped-drain(LDD) doping profile 20 of the MOSFET.

Figure 2:
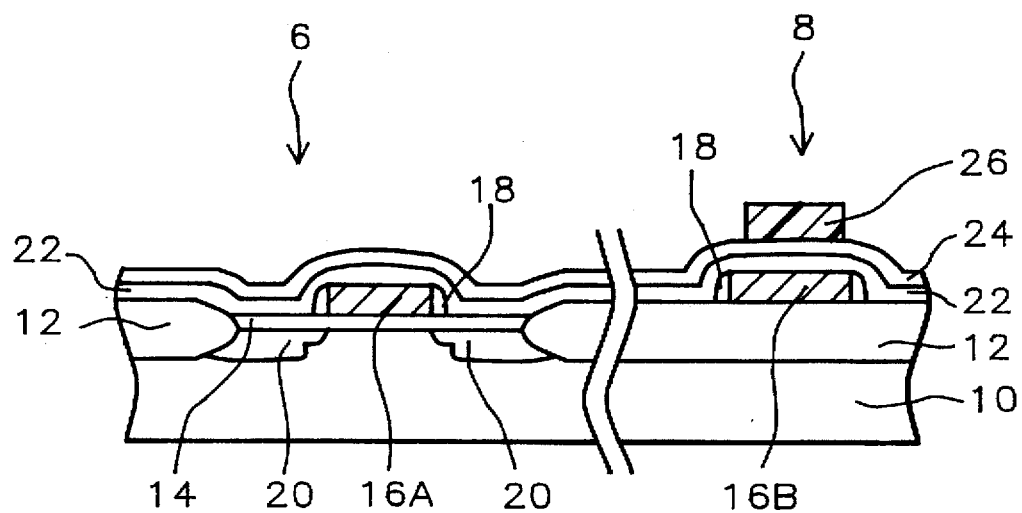

Referring next to FIG. 2, a layer of dielectric material 22, for example silicon oxide, is deposited over the wafer using LPCVD. The thickness of this layer is determined by the design specifications of the capacitor and is typically between about 250 and 750 Å thick. This layer is followed by a second layer 24, also deposited by LPCVD, of silicon oxynitride ($SiO_xN_y$). The $SiO_xN_y$ is deposited using silane and nitrous oxide at a temperature of between about 325° C. and 375° C. The $SiO_xN_y$ layer is between about 100 and 600 Å thick.

Photoresist 26 is deposited over the wafer and patterned with a mask which defines the capacitor dielectric. The $SiO_xN_y$ layer 24 is then etched by RIE using a mixture of $SF_6$, HBr, and He. The silicon oxide layer 22 need not be etched away since it becomes the base for the subsequently deposited inter-level-dielectric(ILD) layer.

Figure 3:
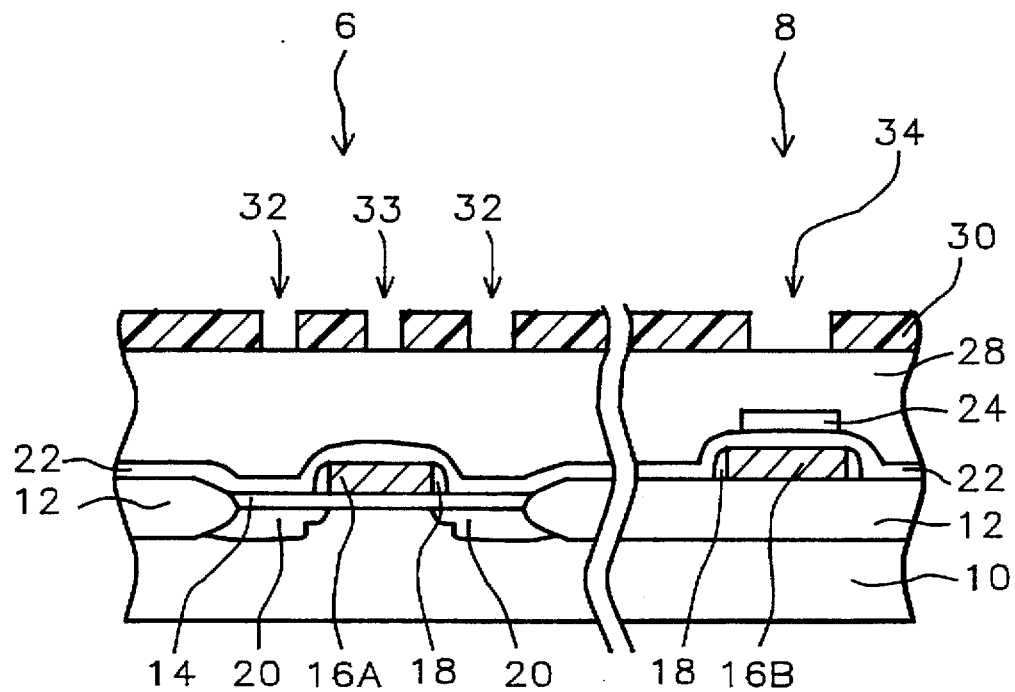

Referring now to FIG. 3, the photoresist 26 is stripped, preferably by plasma ashing, and the ILD layer 28 comprising, for example a borophosphosilicate glass (BPSG), is deposited using LPCVD. The surface of the ILD layer 28 is then planarized, for example, by chemical-mechanical-polishing(CMP) or simply by thermally flowing the glass.

A layer of photoresist 30 is applied and patterned to define the device contact openings 32 as well as the opening 34 which is to contain a metal plug which forms the second electrode of the capacitor.

The contact etch is performed using RIE. A preferred etchant which provides a sufficient selectivity for silicate glasses is $CHF_3$ and $C_2F_6$ in helium although other combinations of fluorocarbons may be used. The $CHF_3/C_2F_6$/He composition provides a selectivity of $SiO_2$ over $SiO_xN_y$ of about 12:1.

Figure 4:
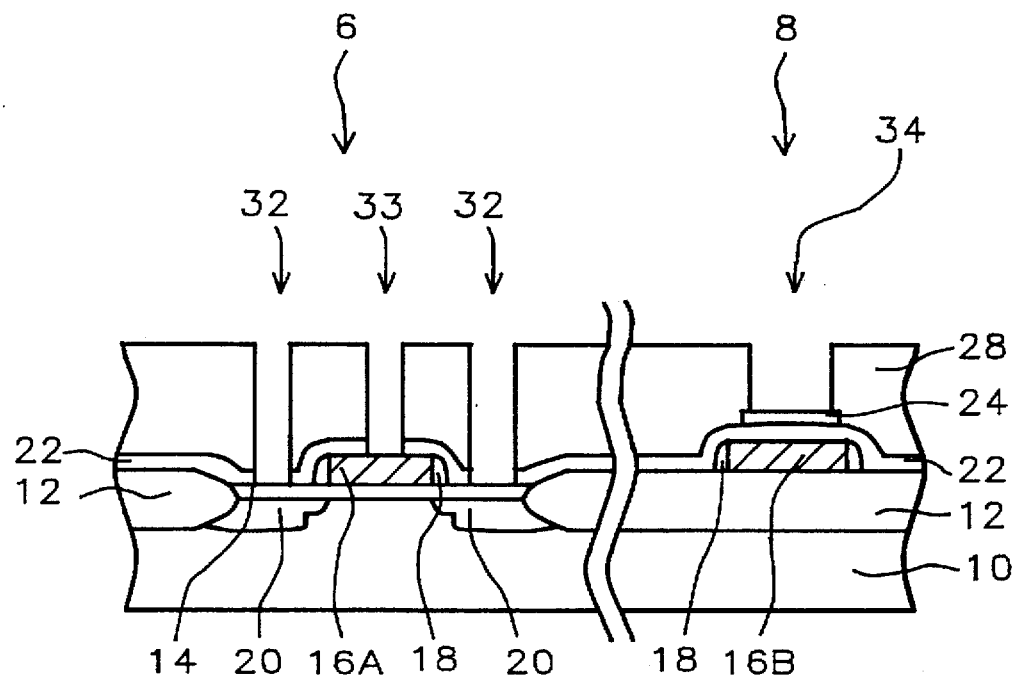

FIG. 4 shows the resultant cross section after the photoresist has been stripped. The device contact openings 32 to the active regions in the silicon 20 and to the polysilicon gate 16A have been completed. However, the $SiO_xN_y$ layer 24 in the capacitor opening 34 has protected the capacitor dielectric layer 22 beneath it from the etchant.

The selection of the composition of the $SiO_xN_y$ layer 24 depends upon the durability requirements of the layer as an etch stop, specifically, upon the degree and tolerance of over etching required of the ILD layer to assure proper opening of all contacts. As can be seen in FIG. 4, when surface planarization is used, the depths of the contact openings vary. Thus over-etching of the shallower contacts is required in order to open the deeper ones. The durability of the etch-stop layer 24 is thus dependent upon the amount of over-etching required. This is regulated by the thickness of the layer and its composition. The rule to be followed is to chose a composition and thickness which will provide adequate but not excessive over-etch tolerance. This is to facilitate the subsequent removal of the layer 24 prior to the deposition of the contact plug.

The wafer is then dipped into hot 85% phosphoric acid to remove the $SiO_xN_y$ 24 from the base of the capacitor opening 34. Care must be exercised here to avoid over-etching. Alternately, the $SiO_xN_y$ may be removed with RIE using a $SF_6$/He/HBr chemistry.

Figure 5:
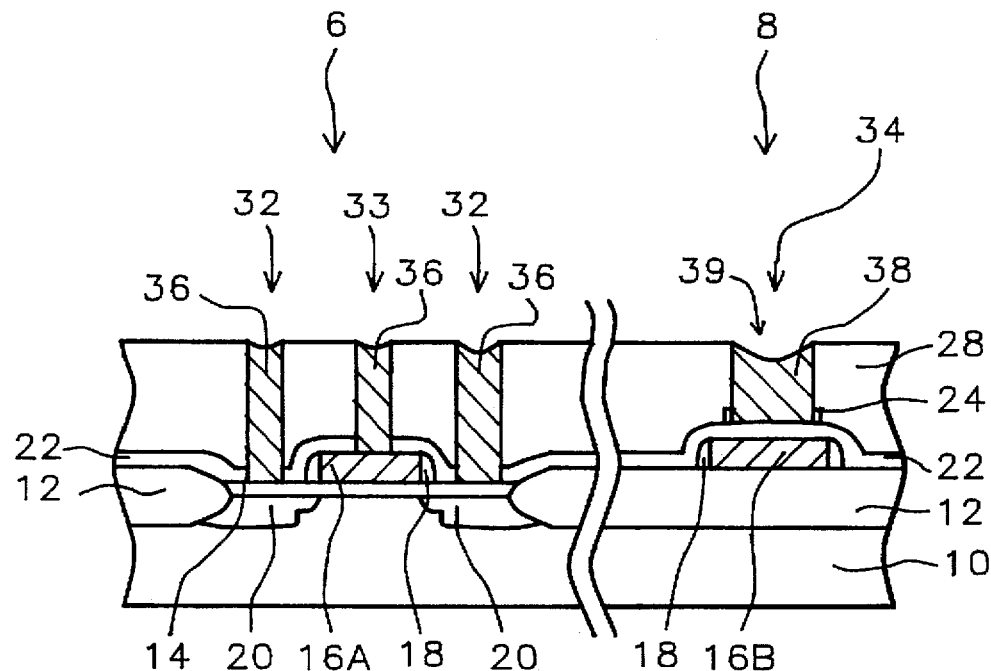

Procedures, well known to those in the art, are then used to form conductive contact plugs in the openings 32 and 34. Such contact plugs typically employ a contact/glue layer comprising Ti/TiN or Ti/TiW to line the opening, followed by the deposition of LPCVD tungsten. After the tungsten is deposited a blanket RIE etchback is preformed to remove the tungsten over the surface leaving the isolated tungsten plugs 36,38 as shown in FIG. 5. The tungsten fills the smaller contact plug openings 36. However, depending upon the size of the opening required for the capacitor plate 38, a depression 39 may occur.

Figure 6:
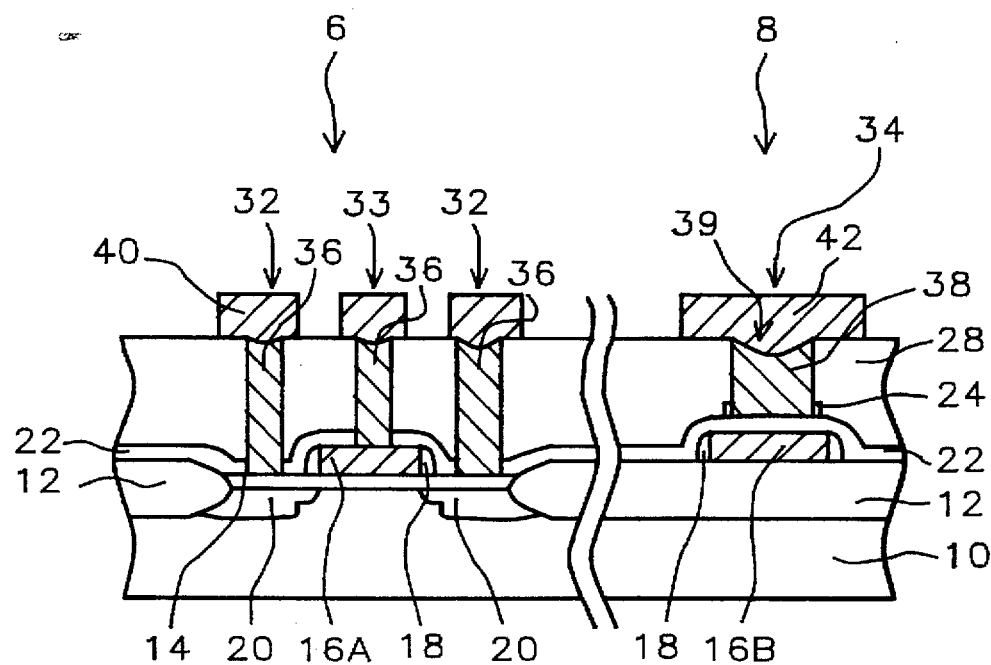

Referring next to FIG. 6, a metal layer 40, 42, for example comprising aluminum or copper or an alloy thereof is deposited over the wafer and patterned by well known photolithographic and etching techniques to form a first layer of metal wiring. The capacitor 34 is now complete. Its first terminal, the polysilicon land 16B, is connected into the wiring circuit via a tungsten plug, comparable to the MOS-FET gate electrode 33, located elsewhere, for example in an area above or behind the plane of the page. The second terminal 38 is connected by the metal land 42.

Figure 7:
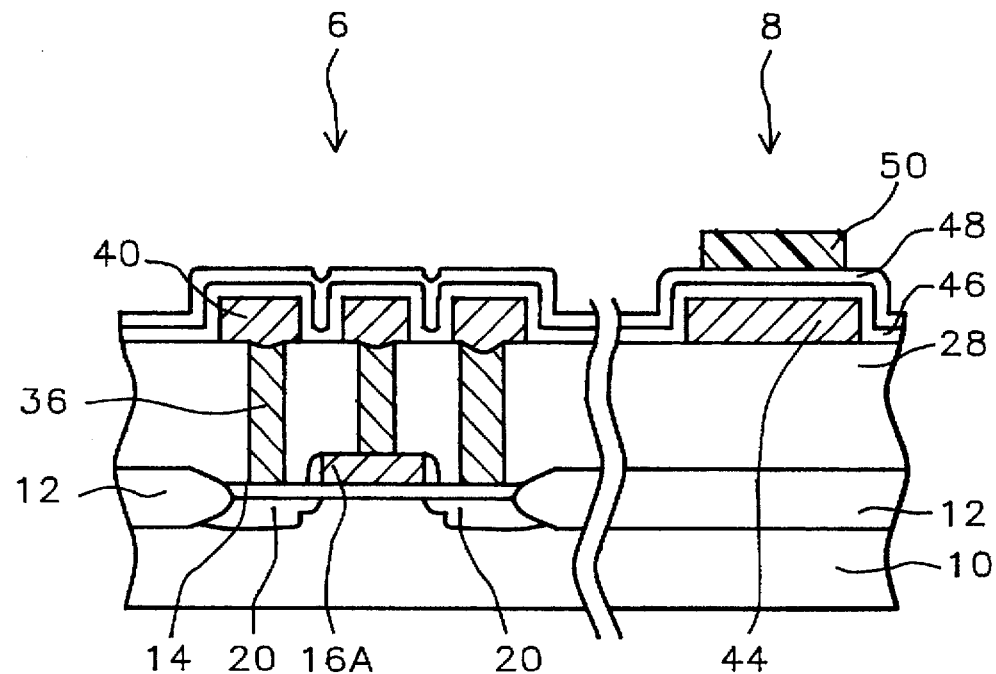
FIG. 7 through FIG. 10 are wafer cross sections showing the processing steps used to form a second embodiment of this invention.

In a second embodiment, a capacitor is constructed having plates formed from two successive layers of metallization. Referring to FIG. 7, the formation of the capacitor begins with a p-type silicon wafer 10. Semiconductor devices 6 have been formed within its surface and a first ILD layer 28, for example BPSG, has been deposited. After planarization of the ILD layer 28 by, for example CMP, contact plugs 36 connecting to the active areas 20 of the semiconductor devices are formed and a first metallization layer 40 is formed and patterned to provide conductive circuit paths to the contacts 36. In the region 8 the metallization layer is patterned to form the lower conductive plate connection 44 of the capacitor.

A layer of dielectric material 46, for example silicon oxide, is deposited over the wafer 10 using LPCVD. The thickness of this layer is determined solely by the design specifications of the capacitor and is typically between about 250 and 750 Å thick. This layer is followed by a silicon oxynitride $SiO_xN_y$ layer 48, also deposited by LPCVD. The $SiO_xN_y$ is deposited using silane and nitrous oxide at a temperature of between about 325° C. and 375° C. The $SiO_xN_y$ layer is between about 100 and 600 Å thick.

Photoresist is deposited and patterned over the wafer to form the mask 50 which protects the $SiO_xN_y$ layer 48 over the conductive plate 44. The $SiO_xN_y$ layer 48 elsewhere is then removed by RIE using $CHF_3$ and $C_2F_6$ in helium.

Figure 8:
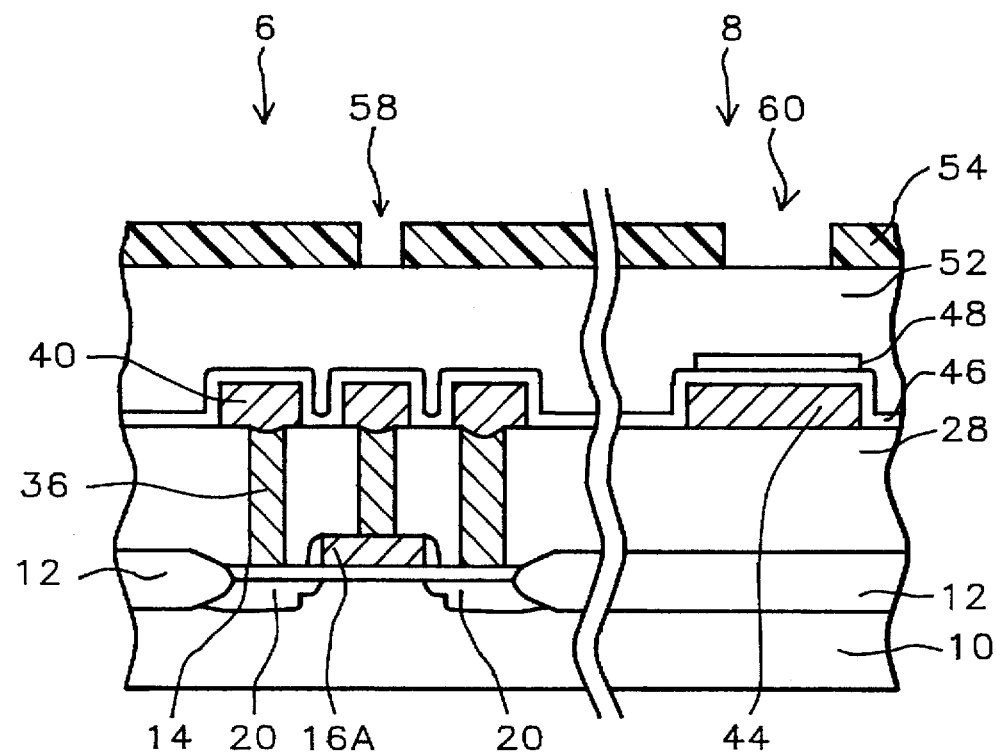
Figure 9:
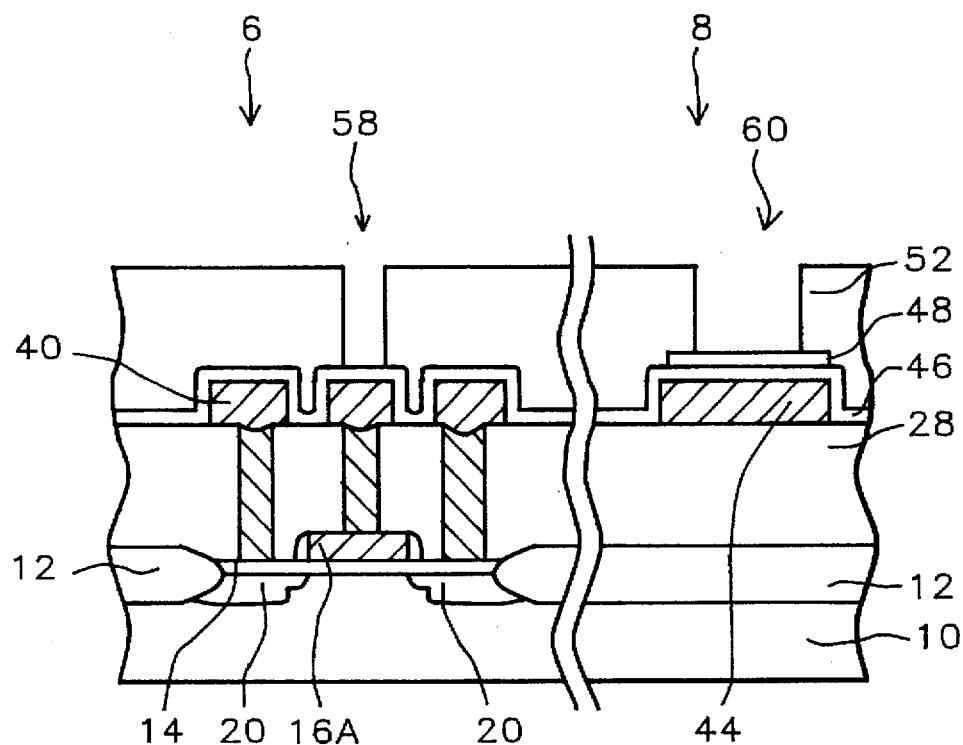

Referring now to FIG. 8, the residual $SiO_xN_y$ layer 48 is shown over the capacitor dielectric 46. A second ILD layer 52, for example BPSG, is deposited over the wafer 10 and planarized, for example by CMP. A photoresist layer 54 is deposited and patterned for the first level of via openings 58 to the metallization level 40. An opening 60 is also patterned over the capacitor. A unidirectional etch, for example RIE is then used to create the openings 58 and 60 as shown in FIG. 9. The preferred etchant is $CHF_3$ and $C_2F_6$ in helium. As illustrated in FIG. 9, the $SiO_xN_y$ 48 protects the capacitor dielectric 46 in the opening 60 from the RIE, while subjacent metal 40 in the via opening 58 is exposed. Removal of the $SiO_xN_y$ 48 from the base of the capacitor opening 60. is accomplished by RIE using a $SF_6$/He/HBr chemistry.

Figure 10:
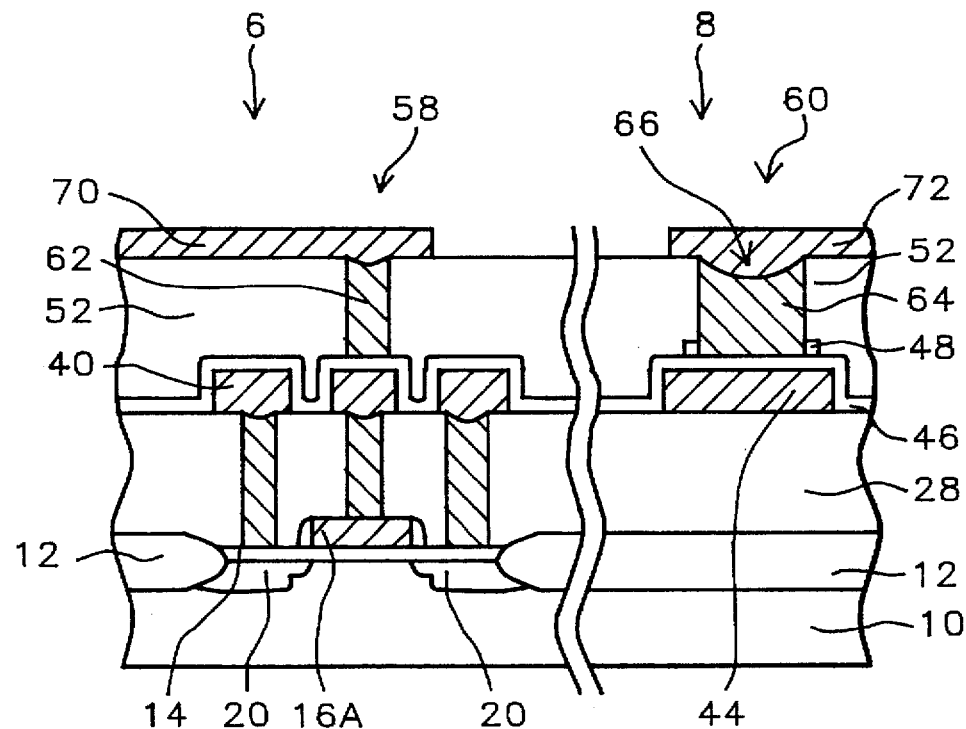

Procedures well known to those in the art are then used to form conductive contact plugs in the openings 58 and 60. Such contact plugs typically employ a contact/glue layer comprising Ti/TiN or Ti/TiW to line the opening, followed by the deposition of LPCVD tungsten. After tungsten is deposited a blanket RIE etchback is preformed to remove the tungsten over the surface leaving the isolated tungsten plugs 62, 64 as shown in FIG. 10. The tungsten 62 fills the smaller via openings 58. However, depending upon the size of the opening required for the capacitor plate 60, a depression 66 in the tungsten plug 64 may occur.

A metal layer, for example comprising aluminum or copper or an alloy thereof is deposited over the wafer and patterned by well known photolithographic and etching techniques to form a the lands 70, 72 which comprise a second level of circuit wiring. The capacitor 60 is now complete. Its first terminal, the metal land from the first metallization level 44, is connected into the wiring circuit via a tungsten plug, comparable to the plug 62 and elsewhere, for example above or behind the plane of the page. The second terminal 66 is connected by the metal land 72 formed from the second metallization level.

The second embodiment was described using a first and second level of metallization to form the capacitor of this invention. These concepts can obviously be extended and generalized to the utilization of any two successive layers of metallization which are separated buy an insulative layer. This embodiment also employed a conductive plug to form the upper terminal of the capacitor. Alternatively, conventional metal via technology, wherein the second metallization is deposited directly into the via openings, may likewise be used to form the upper terminal of the capacitor.

Figure 11:
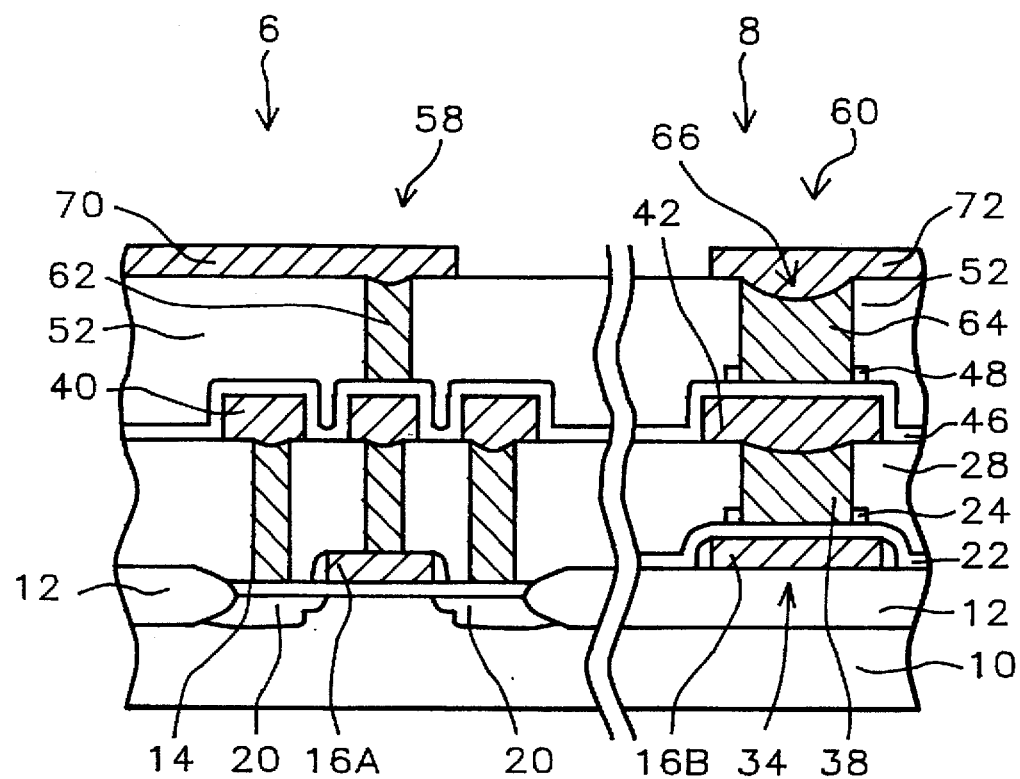
FIG. 11 is a wafer cross sections illustrating a third embodiment of this invention.

A third embodiment of this invention comprises the formation of a plurality of capacitors at several levels. Such a structure is shown in FIG. 11. Where the capacitors of the first and second embodiments are formed in one stack. In circuit designs where lateral space is limited, and greater capacitor area is needed, the capacitors 34 and 60 may be connected in parallel by connecting the polysilicon land 16B with the metal land 72. Extension of this concept to multiple capacitors is hereby implied.

The embodiments of this invention use a p-type silicon substrate. It should be well understood by those skilled in the art that other type substrates may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

While the embodiments described relate to MOSFET or integrated circuits, the principles of this invention are also applicable to bipolar or BiCMOS technology. Although the invention has been particularly shown and described with reference to the preferred embodiments thereof, it will be understood by those skilled in the art that various changes in form and details may be made without departing from the spirit and scope of the invention.

What is claimed is:

1. A method of forming a capacitor on a silicon wafer comprising:

(a) providing a silicon wafer;

(b) forming a first insulative layer on said silicon wafer;

(c) forming a first conductive layer over said first insulative layer;

(d) patterning said first conductive layer to form a first plate of said capacitor, said first plate having means for connection to external circuitry;

(e) forming a second insulative layer over said first conductive layer;

(f) depositing an etch-stop layer over said second insulative layer;

(g) depositing a first photoresist layer over said wafer;

(h) patterning said first photoresist layer to protect said first plate;

(i) removing said etch-stop layer not protected by said first photoresist layer;

(j) removing said first photoresist layer;

(k) depositing a third insulative layer over said silicon wafer;

(l) depositing a second photoresist layer over said silicon wafer;

(m) patterning said second photoresist layer to define a second plate of said capacitor;

(n) etching said third insulative layer with a unidirectional etching technique, thereby creating a first opening and exposing said etch-stop layer;

(o) removing said second photoresist layer;

(p) removing said etch-stop layer from said first opening;

(q) depositing a second conductive layer over said silicon wafer;

(r) etching said second conductive layer with a unidirectional etching technique, thereby leaving a plug of said second conductive layer in said first opening which comprises said second plate of said capacitor;

(s) depositing a third conductive layer; and (t) patterning said third conductive layer thereby forming a connective wiring stripe to said plug.

2. The method of claim 1 wherein said first insulative layer is selected from the group consisting of silicon oxide, a phosphosilicate glass, and a borophosphosilicate glass.

3. The method of claim 1 wherein said first conductive layer is selected from the group consisting of polysilicon, aluminum, an aluminum alloy, copper, and a copper alloy.

4. The method of claim 1 wherein said second insulative layer is silicon oxide.

5. The method of claim 1 wherein said etch-stop layer is selected from the group consisting of silicon nitride, silicon oxynitride, and aluminum oxide.

6. The method of claim 1 wherein said etch-stop layer is deposited by LPCVD.

7. The method of claim 1 wherein said etch-stop layer is deposited by sputtering.

8. The method of claim 1 wherein said etch-stop layer is between about 100 and 600 Angstroms thick.

9. The method of claim 1 wherein said third insulative layer is selected from the group consisting of silicon oxide, a phosphosilicate glass, and a borophosphosilicate glass.

10. The method of claim 1 wherein said etch-stop layer not protected by said first photoresist layer is removed by RIE using a $SF_6$/He/HBr chemistry.

11. The method of claim 1 wherein said etch-stop layer is removed from said first opening by a dip into 85% Phosphoric acid at 125° C. for 3 to 30 minutes.

12. The method of claim 1 wherein said etch-stop layer is removed from said first opening by RIE using a $SF_6$/He/HBr chemistry.

13. The method of claim 1 wherein said second conductive layer is tungsten.

14. The method of claim 1 wherein said unidirectional etching technique is reactive-ion-etching.

15. The method of claim 1 wherein said third conductive layer is selected from the group consisting of aluminum, an aluminum alloy, copper, and a copper alloy.

16. The method of claim 1 wherein said means for connection to external circuitry comprises an extension contacted by a second conductive plug.

17. A method of forming an integrated circuit having semiconductor devices and capacitors comprising:

(a) providing a silicon wafer having active areas enclosed by field isolation;

(b) forming a first insulative layer over said active areas;

(c) depositing a polysilicon layer over said silicon wafer;

(d) patterning and etching said polysilicon layer by photolithographic techniques to form polysilicon gate electrodes for self-aligned polysilicon gate MOSFETs and first conductive plates of said capacitors, said first conductive plates having means for connection to said integrated circuit;

(e) implanting ions thereby forming source and drain elements of said MOSFETs and increasing the conductivity of said polysilicon gate electrodes and said first conductive plates;

(f) forming a second insulative layer over said polysilicon layer;

(g) depositing an etch-stop layer over said second insulative layer;

(h) depositing a first photoresist layer over said silicon wafer;

(i) patterning said first photoresist layer to protect said etch-stop layer over said first conductive plates;

(j) removing said etch-stop layer not protected by said first photoresist layer;

(k) removing said first photoresist layer;

(l) depositing a third insulative layer over said silicon wafer;

(m) depositing a second photoresist layer over said silicon wafer;

(n) patterning said second photoresist layer to define contact openings to said MOSFETs and second conductive plate openings to said capacitors;

(o) etching said third insulative layer with a unidirectional etching technique, thereby forming contact openings to said MOSFETs and second conductive plate openings exposing said etch-stop layer at the bases thereof;

(p) removing said second photoresist layer;

(q) removing said etch-stop layer from said second conductive plate openings;

(r) depositing a first conductive layer over said silicon wafer;

(s) etching said first conductive layer with a unidirectional etching technique, thereby leaving isolated conductive plugs in said contact openings and said second conductive plate openings;

(t) depositing a second conductive layer;

(u) patterning said second conductive layer thereby forming connective wiring to said conductive plugs;

(v) forming additional wiring levels for said integrated circuit as dictated by its design.

18. The method of claim 17 wherein said first insulative layer is silicon oxide.

19. The method of claim 17 wherein said second insulative layer is silicon oxide.

20. The method of claim 17 wherein said etch-stop layer is selected from the group consisting of silicon nitride, silicon oxynitride, and aluminum oxide.

21. The method of claim 17 herein said etch-stop layer is deposited by LPCVD.

22. The method of claim 17 wherein said etch-stop layer is deposited by sputtering.

23. The method of claim 17 wherein said etch-stop layer is between about 100 and 600 Angstroms thick.

24. The method of claim 17 wherein said third insulative layer is selected from the group consisting of silicon oxide, a phosphosilicate glass, and a borophosphosilicate glass.

25. The method of claim 17 wherein said etch-stop layer not protected by said first photoresist layer is removed by RIE using a $SF_6/He/HBr$ chemistry.

26. The method of claim 17 wherein said etch-stop layer is removed from said second conductive plate openings by RIE using a $SF_6/He/HBr$ chemistry.

27. The method of claim 17 wherein said first conductive layer is tungsten.

28. The method of claim 17 wherein said unidirectional etching technique is reactive-ion-etching.

29. The method of claim 17 wherein said second conductive layer is selected from the group consisting of aluminum, an aluminum alloy, copper, and a copper alloy.

30. The method of claim 17 wherein said means for connection to said integrated circuit comprises a polysilicon extension contacted by a conductive plug.

* * * * *